United States Patent [19]

Bjorklund et al.

[11] 3,892,596

[45] July 1, 1975

[54] UTILIZING ION IMPLANTATION IN COMBINATION WITH DIFFUSION TECHNIQUES

[75] Inventors: Fritz Lars Gunnar Bjorklund, Tyreso; Eva Matzner, Stockholm, both of Sweden

[73] Assignee: Telefonaktiebolaget L M Ericsson, Stockholm, Sweden

[22] Filed: Oct. 25, 1973

[21] Appl. No.: 409,761

[30] Foreign Application Priority Data

Nov. 9, 1972 Sweden ............................ 14522/72

[52] U.S. Cl. ...................... 148/1.5; 29/576; 29/577; 29/578; 148/175; 148/187; 357/49; 357/50; 357/51; 357/91

[51] Int. Cl. ........................... H01l 7/54; H01l 27/02

[58] Field of Search ..................... 148/1.5, 175, 187; 317/235 AY, 235 E, 235 F; 29/576–578; 357/49, 50, 51, 91

[56] References Cited

UNITED STATES PATENTS

| | | | |
|---|---|---|---|
| 3,448,344 | 6/1969 | Schuster et al. | 317/235 X |
| 3,489,963 | 1/1970 | Gillett | 317/235 |
| 3,500,139 | 3/1970 | Frouin et al. | 148/175 X |
| 3,596,347 | 8/1971 | Beale et al. | 29/578 X |
| 3,615,932 | 10/1971 | Makimoto et al. | 148/175 |
| 3,648,125 | 3/1972 | Peltzer | 317/235 |
| 3,729,811 | 5/1973 | Beale et al. | 148/1.5 X |
| 3,761,319 | 9/1973 | Shannon | 148/1.5 |
| 3,796,929 | 3/1974 | Nicholas et al. | 317/235 AY |

*Primary Examiner*—L. Dewayne Rutledge
*Assistant Examiner*—W. G. Saba
*Attorney, Agent, or Firm*—Hane, Baxley & Spiecens

[57] ABSTRACT

The invention relates to a method for producing integrated circuits of high packing density in a single crystalline substrate. The method contemplates that initially the transistors of the circuits are produced with a separate subcollector in respective mutually spaced regions of the substrate in such a manner that impurity ions are introduced through a number of consecutive diffusion process steps. The regions are provided with separate isolation barriers approaching the outer edges of the respective subcollectors. Thereafter, the resistors in the circuits are produced in respective regions located adjacent the isolation barriers for the transistors in such manner that impurity ions are introduced by at least one injection process step.

2 Claims, 1 Drawing Figure

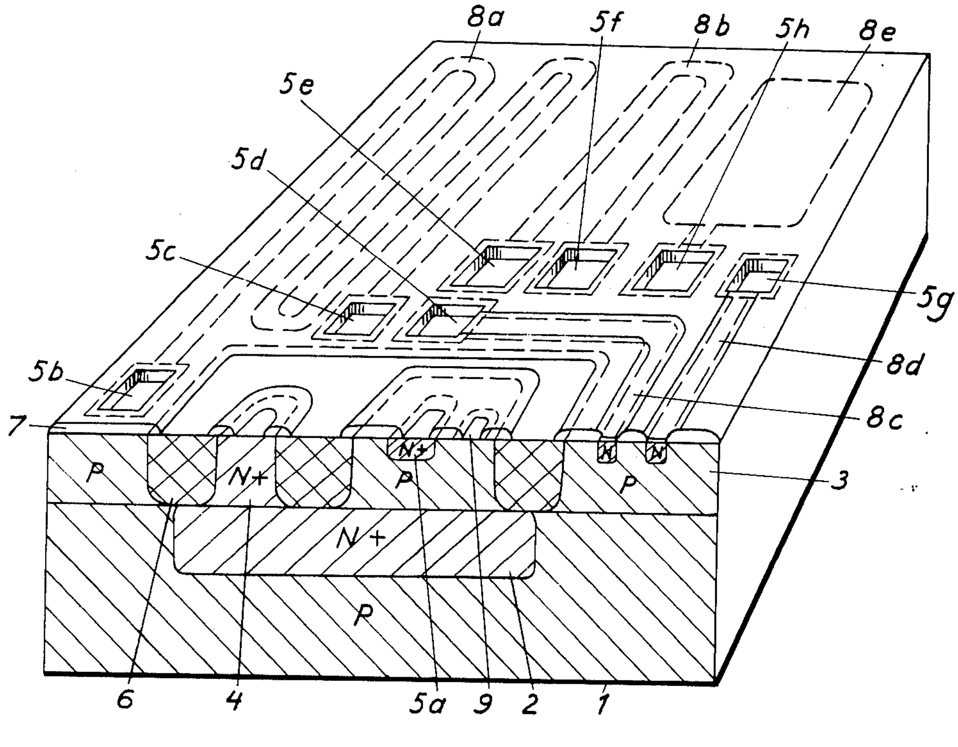
8a
5f
8b
5h
8e
5e
5d
5c
5g
5b
8d
7
8c
P
N+
P
N+
N
N
P
3
N +
P
6
4
5a
9
2
1

UTILIZING ION IMPLANTATION IN COMBINATION WITH DIFFUSION TECHNIQUES

The invention relates to a method for producing integrated circuits of high packing density in a single crystalline substrate.

Conventional integrated circuit structures wherein circuits are produced in a single crystalline substrate utilize a P type silicon substrate having an N type epitaxial layer. In this epitaxial layer the transistors and resistors of the circuits are produced and enclosed separately within P type isolation barriers which are indiffused completely through the epitaxial layer to make electrical contact with the P type substrate. When the circuits are operating, a high-resistive isolation is obtained between all the components because the PN interface between the substrate and of the isolating barriers and the epitaxial layer is back biased.

In such conventional structure an NPN transistor can be produced by diffusing into the epitaxial layer and within an isolation barrier a shallow P type region into which a smaller N type region is thereafter diffused. The superimposed N type epitaxial layer, P type region and N type region form the collector, base and emitter electrodes respectively of the NPN transistor. Moreover, a circuit resistor can be produced by diffusing into the epitaxial layer and within an isolation barrier a shallow, P type region of the same kind as is employed to form the base electrode of the NPN transistor and utilizing the resistance between two mutually spaced points in that P type region.

The conventional structure described above has from the production point of view the advantage that the P type regions of the circuit resistors and of the base electrodes in the NPN transistors respectively can be produced in one and the same diffusion step. In order to obtain a desired characteristic for the NPN transistor the P type regions should be produced in an epitaxial layer with a thickness of for example 5 microns and be given a resistivity of 1000 ohm-$mm^2$ per meter. The P type regions of the circuit resistors are given the form of a thin strip which is provided with two terminal contacts. For circuit resistors with high resistance values the width of the strip should be chosen as small as possible with regard to structural inhomogeneities and optical reproducability during pattern-copying. Normally a strip width of about 10 microns is chosen. Moreover the strip can suitably be sinuous within a rectangular area with an isolating distance of the same magnitude as the strip width being chosen. It can now easily be computed from the above mentioned numerical values that a circuit resistor which is produced within an area of for example $0.2 \times 0.2$ $mm^2$ corresponding to the area which a transistor occupies in the above described structure cannot have a greater resistance value than about 30,000 ohm.

When producing a function unit that consists of a number of circuits in the form of a number of single crystalline substrates in which the components of the circuits are integrated, the production cost of the function unit can be written as the product of the number of substrates and the average production cost per substrate. An increased packing density for the components in the substrate is consequently profitable, only if it is capable of reducing the required number of substrates in the function unit to a greater extent than what the average production cost per substrate eventually will increase.

In function units, composed of common integrated circuits of high packing density an improved profitability as compared with the above mentioned conventional structure is in most cases not obtained by utilizing the method of making semi-conductor components, transistors, resistors, and so on, which presently yields the largest packing density, namely the introduction of impurity ions into the substrate or the epitaxial layer by means of one or more injection process steps as it is described for example in the German Pat. application No. 1938365. One reason is that injection-processed transistors are required in larger number than diffusion-processed transistors because the former tend to have lower current gain. The lower gain arises because the injection process in contrast to the diffusion process results in lattice inhomogeneities under the exposed crystal surfaces and these lattice inhomogeneities when they once have been created cannot be eliminated by a subsequent treatment. Another reason is that upon integration with high packing density the temperature at the barrier layer in the collector electrode of the transistors has a certain maximum value which together with the thermal resistance of the employed semi-conductor components determines an upper limit for the dissipation power per component. For the signal amplitudes and the load resistances which are used for example in common logic circuits the transistors are loaded with a dissipation power of 0.1 mW. Because of the need for heat dissipation the transistors must be given a minimum area of such magnitude that it takes a considerably longer time, implying an associated cost, to produce them by means of an injection process technique than by means of diffusion process technique. The drawback of a lower current gain factor must also be added.

A somewhat improved profitability as compared with the conventional diffused structure can be obtained by a special method for compact diffusion production of transistors. This method, in principle, first produces transistors with a separate subcollector in respective mutually spaced regions in the substrate, whereupon these regions are provided with their respective isolation barriers approaching the outer edge of the subcollector. Two variants of the method are described in Electronics, Mar. 1. 1971 under the title "Isolation method shrinks bipolar cells for fast, dense memories" and in the same journal, July 9, 1972 under the title "Collector diffusion isolation packs many functions on a chip" respectively. The improvement in profitability is however, insignificant, even when the area of the transistors is reduced without any essential increase in the production cost per substrate because small transistor areas and operating currents mean large circuit resistors. A dissipation power of for example 0.1 mW per transistor means a resistance of 30–300 kohm for the circuit resistors obtained by diffusion production together with the compact transistors. These circuit resistors will then occupy considerably greater areas than the circuit transistors. This lack of proportionality can be somewhat equalized for example by the method for reducing the requisite diffusion area for resistors which in described in the Swedish Pat. No. 354,143. The crux of the idea is to make the resistors thinner by means of etching them.

The present invention relates to a method capable of yielding a considerably improved and, with the techniques of today, probably maximal profitability for the production of function units composed of monolithic circuits of the standard type thanks to the fact that it utilizes the respective advantages of the previously known methods with the elimination of their respective drawbacks. It exploits especially the advantage of the diffusion processed transistor to yield a high current gain even when the construction is compact and combines it with the advantage of the injection processed resistor to yield to high packing density due to its well-defined area that does not need to be limited by means of a spacious isolation barrier.

The method of the invention is characterized in that first the transistors in the circuits are produced with a separate subcollectors in respective regions mutally spaced in the substrate in such manner that impurity ions are introduced through a number of consecutive diffusion process teps, these steps, being provided with separate isolation barriers approaching the outer edge of the respective subcollectors. Thereafter, the resistors in the circuits are produced in their respective regions located adjacent the isolation barriers for the transistors in such manner that impurity ions are introduced through at least one injection process step.

The invention will be described more in detail with reference to the accompanying drawing whose sole FIGURE shows a semi-conductor device which has been produced according to the method of the invention.

The device includes a P type single crystalline substrate 1 that has been provided with an indiffused N+ type region 2. Thereafter the substrate 1 and region 2 has grown thereon a thin P type epitaxial layer 3 with a thickness of 1.5 microns according to the example. An N type region 4 is indiffused into the epitaxial layer 3 so deeply that it penetrates down to the N+ type region 2 to make electrical contact therewith. Furthermore a number of shallow, N+ type regions 5*a–h* are diffused into the epitaxial layer 3 in addition to the N+ type region 4. A region 6 is formed between and around the regions 4 and 5*a* by means of etching and thereafter growing a high resistive material, according to the example a poly cristalline material. The region 6 constitutes a nonconductive isolation barrier spaced from the N+ type region 5*a* but approaching the N+ type region 4.

On top of the epitaxial layer 3 there is an oxide layer 7 which according to the example has a thickness of 1000 Angstrom and in a number of definite places has by means of etching been reduced to a thickness of 200 Angstrom, according to the example. Thereafter, the layer 7 is exposed to a beam of N type ions with an energy of 40 KeV according to the example. These N type ions easily pass through the thinned portions of the the thin oxide layer and penetrates the epitaxial layer 3 down to a depth of about 8000 Angstrom. However they are stopped by the oxide which has been left intact during the etching process. By means of the exposure to the ion beam shallow, N type regions 8*a*–are formed in places so located that they approach their respective diffused N+ type region 5*b–h*, and thus are in electrical contact with the same.

Windows are etched in the oxide layer 7 in known manner for uncovering the N+ type regions 5*a–h* and the N+ type region 4. Furthermore, the region 6 and a region 9 located between the N+ type region 5*a* and the N+ type region 2 in the P type epitaxial layer 3 are uncovered. The semi-conductor device is in fact shown in a stage of production immediately before electrical contacts are to be formed, the uncovered regions 4, 9 and 5*a* forming collector-, base and emitter electrode respectively to an NPN transistor, the uncovered area of the region 6 forming a contact electrode to a shield for the NPN transistor, the regions 5*b–g* forming contacts to the resistors constituted by the regions 8*a–d* and the region 5*h* forming a contact to a capacitor constituted by the region 8*e* and the epitaxial layer 3. The regions 8*a–e* are each electrically isolated when their respective PN interface with the epitaxial layer 3 are given a bias in the backward direction.

We claim:

1. The method of making an integrated circuit of at least one resistor and one transistor comprising the steps of providing a crystalline substrate of a first type of semi-conductor material having diffused into a first region of one surface thereof impurity atoms of a second type, epitaxially growing on said one surface a layer of said first type of semiconductor material, diffusing impurity atoms of second first type into a second region of said layer within said first region to such a depth to electrically contact said first region andinto a third region of said layer within said first region to a depth insufficient to electrically contact said first region, etching said epitaxially grown layer away in a first annular region surrounding said second region and a second annular region connected to said first annular region and surrounding said third annular region, filling said annular regions with a high resistance material, and injecting a beam of impurity ions of a second type along a line in the surface of said epitaxially grown layer outside the area enclosed by said annular regions to form passive elements.

2. The method of claim 1 further comprising, while diffusing said impurity atoms of the second type into said second and third regions, simultaneously diffusing such atoms into at least two terminal regions outside the area enclosed by said annular regions and wherein the line along which said beam of impurity ions is injected connects said terminal regions.

* * * * *